United States Patent [19]
Nielsen

[11] Patent Number: 6,009,133
[45] Date of Patent: Dec. 28, 1999

[54] METHOD OF REGULATING A DIGITAL PHASE-LOCKED CIRCUIT, AND A DIGITAL PHASE-LOCKED CIRCUIT HAVING A VOLTAGE-CONTROLLED OSCILLATOR

[75] Inventor: Anders B. Nielsen, Skovlunde, Denmark

[73] Assignee: DSC Communications A/S, Ballerup, Denmark

[21] Appl. No.: 08/755,972

[22] Filed: Nov. 25, 1996

[30] Foreign Application Priority Data

Nov. 24, 1995 [DK] Denmark ................... 1328/95

[51] Int. Cl.⁶ .................. H03D 3/24; H03L 7/06; H03L 7/00
[52] U.S. Cl. .................. 375/374; 375/376; 327/147; 327/160
[58] Field of Search .................. 375/374, 373, 375/376; 327/147, 151, 156, 160; 331/25, 17, 24, 18, 34

[56] References Cited

U.S. PATENT DOCUMENTS 4,864,253  9/1989  Zwack ................... 331/1 A
5,105,160  4/1992  Summers ............... 328/133

FOREIGN PATENT DOCUMENTS 0631407  12/1994  European Pat. Off. ......... H04L 7/00
2282719   4/1995  United Kingdom ............ H03L 7/08

Primary Examiner—Stephen Chin
Assistant Examiner—Albert Park
Attorney, Agent, or Firm—Baker & Botts, L.L.P.

[57] ABSTRACT

A digital phase-locked loop (1) has a counter (4) which counts pulses from a voltage controlled oscillator (8). The counter (4) is latched periodically with a period which is determined by an input signal (I) to the counter (4). The latched value is supplied to a compensation unit (5) which deducts a value which approximately corresponds to half the count counted by the counter circuit (4) when the phase lock is locked correctly. The compensated counts are supplied from the output of the compensation unit (5) to an integrator (6) and counter (9) which applies a control signal to the voltage controlled oscillator (8) via a D/A converter.

6 Claims, 2 Drawing Sheets

METHOD OF REGULATING A DIGITAL PHASE-LOCKED CIRCUIT, AND A DIGITAL PHASE-LOCKED CIRCUIT HAVING A VOLTAGE-CONTROLLED OSCILLATOR

TECHNICAL FIELD OF THE INVENTION

The invention concerns a method of regulating a digital phase-locked circuit, wherein an output signal from a voltage-controlled oscillator is locked to an input signal, and wherein a predetermined mutual ratio of output signal frequency to input signal frequency is intended.

The invention moreover concerns a digital phase-locked circuit having a voltage-controlled oscillator whose output signal is locked to an input signal, and wherein a predetermined mutual ratio of output signal frequency to input signal frequency is intended.

RELATED PATENT APPLICATION

This application claims the benefit of Danish Patent Application Serial No. 1328/95, filed on Nov. 24, 1995.

BACKGROUND OF THE INVENTION

Digital phase-locked circuits of the above-mentioned type are used e.g. in digital data transmission networks, which may be constructed as a synchronous digital hierarchy consisting of a plurality of network elements between which data may be transmitted.

When data are transferred in an SDH system, data are positioned e.g. in a so-called STM-1 frame which consists of 270 columns with 9 bytes in each column. The first 9 columns in a frame contain overhead functions, frame lock, etc. A frame is transferred from one network element to another with a period of 125 μsec. This means that all bits in the frame, which are transmitted serially, e.g. through an optical fibre, must have been transmitted after 125 μsec. For this to be feasible, the bits in an STM-1 frame must be transferred with 155.520 megabits per second.

Of course, it is important that the transfer rate of the complete frame and the timing of the transmission of the individual bits of the frame correspond closely to each other. In other words, it is important that the frame transfer time of 125 μsec. and the bit read-out of 155.520 megabits per second are very accurate.

Therefore, it is desirable that the above-mentioned times are observed, and if this cannot be done, then to ensure that the bit read-out rate is closely bound up with the transfer time of the frame.

It is noted in this connection that the 125 μsec. are not controlled by a reference, but solely by a frequency derived from a transmission channel.

SUMMARY OF THE INVENTION

Now, the object of the invention is to provide a method and a circuit, wherein an output signal frequency is locked accurately to an input signal frequency, which, as mentioned, is important in the transfer in an SDH system.

The object of the invention is achieved by a method of the type defined in the introductory portion of claim 1, which is characterized in that the output signal is supplied to a counter which is latched periodically with a period which is determined by the input signal frequency, and that the latched count is used for controlling the oscillator.

The invention moreover provides a digital phase-locked circuit of the type whose output signal is locked to an input signal and wherein a predetermined mutual ratio of output signal frequency to input signal frequency is intended, which is characterized in that it comprises a counter adapted to count the output signal and a latch circuit adapted to periodically latch a count of the counter in periods determined by the input signal frequency, and that it moreover comprises means to control the oscillator on the basis of the latched count.

It is hereby ensured that when the input signal frequency varies, the output signal will always follow the frequency of the input signal, as the counter applies control signals, determined by the input signal frequency, to the voltage-controlled oscillator. In other words, the data of an STM-1 frame may be received in timed relationship with the transfer time of the frame.

Expediently, the output signal of the counter circuit is transferred to a digital compensation unit. This facilitates regulation in the loop, as counts both above and below a desired value may hereby be processed, without there being "jumps" from a high value to a low value.

For use in an SDH communications system, it is expedient that the output frequency of the voltage-controlled oscillator is regulated to approximately 77.76 MHZ and is locked to the input signal, which has a frequency of approximately 8 kHz, and that the counter, whose maximum value corresponds to the ratio of the frequency of the output signal to that of the input signal, is latched to the value 4859 by correct phase locking. The frame transfer time and the data read-out time are hereby locked to each other, as the ratio of 77.76 MHZ to 8 kHz is precisely 9720.

It is noted in this connection that the frequency of the output signal is 77.76 MHZ, as data may be read out on a positive as well as a negative flank of a pulse. With correct phase locking, the counter thus counts to 9720. Expedient embodiments of the invention are defined in the dependent claims.

BRIEF DESCRIPTION OF THE DRAWINGS

The invention will be explained more fully below with reference to the drawing, which shows an example of a digital phase-locked circuit of the invention.

In the drawing:

FIG. 2 is a symbol diagram of how a counter counts pulses, while

DETAILED DESCRIPTION OF THE INVENTION

Figure 1:
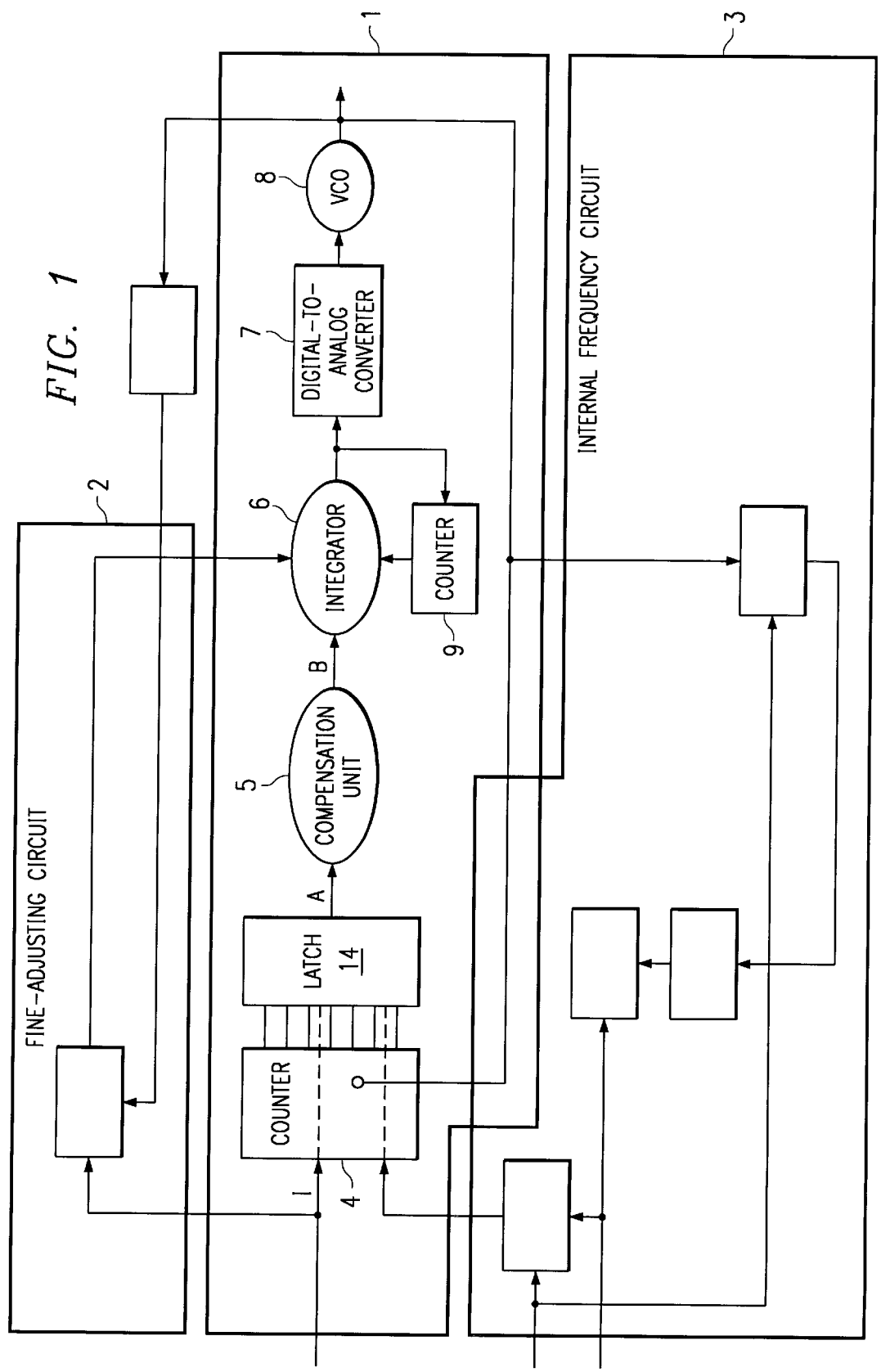
FIG. 1 shows a digital phase-locked circuit of the invention.

In FIG. 1, the digital, phase-locked loop is generally designated by circuit 1, while circuit 2 represents a fine-adjusting circuit for the digital phase-locked circuit of the invention, and circuit 3 generally represents a circuit structure which is adapted to connect an internal frequency if the external frequency should drop out.

However, the circuits 2 and 3 form no part of the present invention and will therefore not be described more fully, as they are not important to the principles of the invention.

In FIG. 1, counter 4 represents a counter which receives an 8 kHz signal on its input I. An output signal is fed back from an output of a voltage-controlled oscillator 8 and is counted in the counter 4. The counter 4 counts the output signal periodically so that a count is latched in the latching circuit 14, e.g. in the middle of each period. The period is determined by the frequency of the input signal I. After each period, the latched value is transferred to a digital compensation unit 5, which may expediently be a subtraction unit which subtracts half the maximum value of the counter from the count of the counter 4. For example, with correct locking between an output signal of 77.76 MHZ and an input signal of 8 kHz, the counter may be arranged as a 14-bit counter which, in case of phase error 0, counts 9720 pulses during a period which is 120 μsec. The number then subtracted in the subtraction unit is one half of 9720, which approximately corresponds to 4859. The output signal from the compensation unit 5 is supplied to an integrator 6 and counter 9 which counts values from the unit 5 and transfers them to a digital-to-analog converter 7, which then provides a control signal for the voltage-controlled oscillator 8 which then adjusts the frequency up or down.

Figure 2:
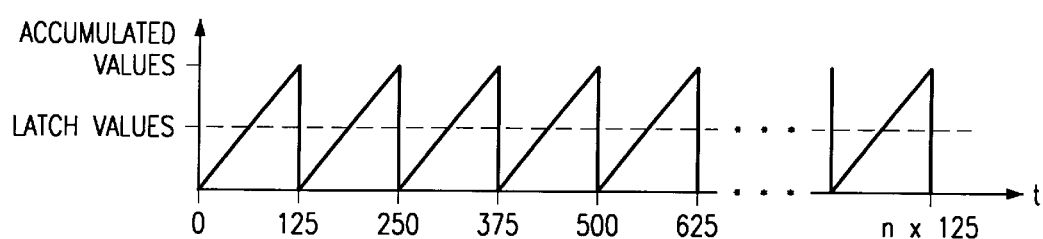

As will be seen in FIG. 2, this figure symbolically illustrates a typical development in the contents of the counter 4 as a function of time. The time axis in FIG. 2 shows accumulated values as they may appear in the counter 4. At about 62.5 μsec., 187.5 μsec., etc., the entered values are latched.

FIG. 2 moreover shows a dashed line which symbolizes the value on the input of the digital compensation unit 5. Numbers just above or below 0 currently occur on the output of the compensation unit 5, cf. FIG. 3.

Figure 3:
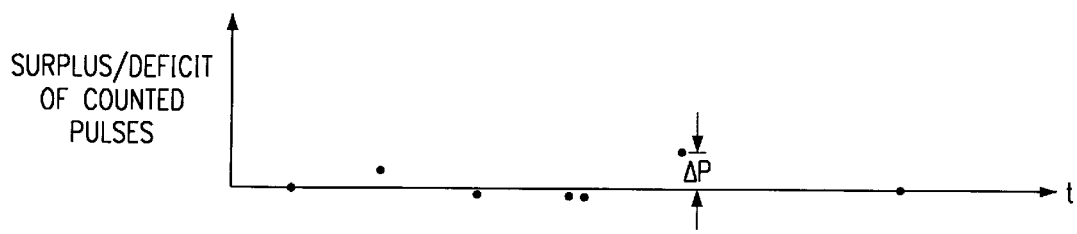
FIG. 3 symbolically shows how phase errors in the loop cause regulation pulses.

FIG. 3 symbolically shows the surplus or deficit of counted pulses at point B of FIG. 1, caused by the circumstance that the phase-locked loop of circuit 1 is not locked property. More particularly, the counter 4 will have counted too much or too little, and a little over 0 or a little under 0 will be counted on the output B of the compensation unit 5. Depending upon whether the value is too high or too low, the voltage-controlled oscillator 8 will be regulated via the digital-to-analog converter 7 in accordance with the output signal from the compensation unit 5. The compensation unit 5 may e.g. be implemented as a subtraction circuit.

Thus, a digital phase-locked circuit is disclosed wherein the output signal is always locked close to the input signal, also if the frequency of the input signal changes slightly.

A particularly expedient application of the phase-locked circuit according to the invention is for use in an SDH communications system, where so-called frames are transferred with a period of 125 μsec., and where the individual bits in the frame are read out with 155.520 megabits/sec.

While the invention has been explained preferably in connection with an SDH system, nothing prevents the invented phase-locked circuits from being used for many other applications where an output signal is to be locked to an input signal.

What is claimed is:

1. A method of regulating a digital phase-locked circuit, comprising the steps of:

receiving an input signal at a counter;

receiving an output signal at the counter;

counting pulses of the output signal to generate a pulse count;

latching the pulse count in response to the input signal;

adjusting the output signal in response to the pulse count to provide a pre-determined mutual ratio of a frequency of the output signal to a frequency of the input signal;

subtracting approximately half of a maximum pulse count from the pulse count to determine a count value.

2. The method of claim 1, further comprising a step of:

generating a control signal in response to the count value.

3. The method of claim 2, wherein the maximum pulse count is 9720 corresponding to the output signal frequency of approximately 77.76 MHz and the input signal frequency of 8 KHz and approximately half the maximum pulse count being 4859.

4. A digital phase-locked circuit, comprising:

a counter operable to receive an input signal and an output signal, the counter operable to count a number of pulses of the output signal;

a latching circuit operable to determine a pulse count from the counter in response to the input signal;

a compensation unit operable to adjust the pulse count, wherein the compensation unit adjusts the pulse count by subtracting approximately half of a maximum pulse count from the pulse count;

an integrator operable to generate a count value from the adjusted pulse count;

a digital-to-analog converter operable to generate a control signal in response to the count value;

an oscillator operable to generate the output signal, the oscillator adjusting the output signal in response to the control signal in order to provide a pre-determined mutual ratio of a frequency of the output signal to a frequency of the input signal.

5. The digital phase-locked circuit of claim 4, wherein the counter counts to a value corresponding to the pre-determined mutual ratio.

6. The digital phase-locked circuit of claim 4, wherein the counter is reset after the pulse count is determined.

* * * * *